US012551787B2

(12) United States Patent
Chung et al.

(10) Patent No.: US 12,551,787 B2
(45) Date of Patent: Feb. 17, 2026

(54) MULTI-DIRECTIONAL OUTPUT DEVICE

(71) Applicant: FORWARD ELECTRONICS CO., LTD., Taipei (TW)

(72) Inventors: Ching-Hao Chung, Taipei (TW); Chun-Lin Huang, Taipei (TW); Hsiu-Chen Li, Taipei (TW)

(73) Assignee: FORWARD ELECTRONICS CO., LTD., Taipei (TW)

( * ) Notice: Subject to any disclaimer, the term of this patent is extended or adjusted under 35 U.S.C. 154(b) by 274 days.

(21) Appl. No.: 18/522,317

(22) Filed: Nov. 29, 2023

(65) Prior Publication Data

US 2024/0207726 A1 Jun. 27, 2024

(30) Foreign Application Priority Data

Dec. 26, 2022 (TW) .................................. 111149952

(51) Int. Cl.

| | |
|---|---|
| ***A63F 13/24*** | (2014.01) |
| ***H05K 1/181*** | (2026.01) |
| ***H05K 5/00*** | (2006.01) |
| ***H05K 5/03*** | (2006.01) |

(52) U.S. Cl.

CPC ............. *A63F 13/24* (2014.09); *H05K 1/181* (2013.01); *H05K 5/0017* (2013.01); *H05K 5/0065* (2013.01); *H05K 5/03* (2013.01); *H05K 2201/10151* (2013.01); *H05K 2201/10265* (2013.01)

(58) Field of Classification Search

None

See application file for complete search history.

(56) References Cited

U.S. PATENT DOCUMENTS

| | | | | |
|---|---|---|---|---|
| 6,344,620 | B1 * | 2/2002 | Nakamura | G05G 9/047 200/6 A |
| 11,815,931 | B2 * | 11/2023 | Zeng | G01D 5/145 |
| 2018/0059710 | A1 * | 3/2018 | Wu | G05G 7/12 |
| 2024/0361846 | A1 * | 10/2024 | Chung | G06F 3/0338 |
| 2025/0231576 | A1 * | 7/2025 | Yu | A63F 13/24 |

* cited by examiner

*Primary Examiner* — Sunit Pandya

(74) *Attorney, Agent, or Firm* — BACON & THOMAS, PLLC

(57) ABSTRACT

A multi-directional output device includes a printed circuit board on which first and second magnetic sensors are arranged, and a direction control unit arranged above the printed circuit board. The direction control unit includes first and second rotary driving bodies, first and second magnets, a shaft stick, a balance washer, and an annular spring, wherein the first and second rotary driving bodies are each a rotatable elongated arc-shaped structure. The first and second magnets are respectively fixed on one end of the first rotary driving body and one end of the second rotary driving body. The balance washer is disposed below the shaft stick and in contact with the first and second rotary driving bodies. The annular spring is arranged under the balance washer and in contact with the balance washer. The first and second magnetic sensors are arranged to correspond to the first and second magnets, respectively.

13 Claims, 6 Drawing Sheets

1012
101
104
106
1021
102
1025
1023
105
107
1031
103
1035
10
1033
X
Y
108
1082
109
111
112
1123
1122
1121
11
12
13
15
16
17
18

MULTI-DIRECTIONAL OUTPUT DEVICE

CROSS-REFERENCE TO RELATED APPLICATIONS

This application claims the benefits of the Taiwan Patent Application Serial Number 111149952, filed on Dec. 26, 2022, the subject matter of which is incorporated herein by reference.

BACKGROUND

Field of the Invention

The present invention relates to a multi-directional output device and, more particularly, to a non-contact miniaturized multi-directional output device driven by magnetic sensing.

Description of Related Art

In existing joysticks used as game consoles or wireless joysticks for mobile devices, carbon film resistors are used, for example, to provide control of the joystick. However, since the control using carbon film resistors is a contact operation, the service life is extremely limited due to the wearing problem caused by brush contact, which cannot satisfy the actual requirements.

Furthermore, in order to avoid the drawbacks of contact joysticks, a direct approach is to use non-contact components to provide joystick control, such as using the magnetic induction principle of Hall elements to control the joystick. However, the accuracy of the non-contact joystick is difficult to control, and the structure of the non-contact joystick complicated and bulky, thereby making it unable to meet the requirements for miniaturization.

Therefore, it is desired to provide an improved multi-directional output device so as to mitigate and/or obviate the existing defects.

SUMMARY

The object of the present invention is to provide a multi-directional output device, in which a non-contact magnetic sensor is used so as to eliminate the wearing problem caused by brush contact, thereby greatly increasing the service life, enhancing the resetting accuracy of the operating shaft to improve the signal accuracy, and reducing the size to design a small-scale control device.

To achieve the object, the multi-directional output device of the present invention includes: a printed circuit board disposed thereon a first magnetic sensor and a second magnetic sensor; and a direction control unit provided on the printed circuit board, and including: a first rotary driving body and a second rotary driving body, each being a rotatable elongated arc-shaped structure and each having an elongated center hole disposed in a center of the corresponding elongated arc-shaped structure, wherein the first rotary driving body is disposed above and crossed perpendicularly with the second rotary driving body so that the elongated center holes are crossed and aligned with each other; a first magnet and a second magnet respectively fixed on one end of the first rotary driving body and one end of the second rotary driving body; a shaft stick having an upper end and a lower end, wherein the upper end passes through the elongated center holes from bottoms of the first rotary driving body and the second rotary driving body; a balance washer disposed under the shaft stick and in contact with the first rotary driving body and the second rotary driving body; and an annular spring disposed under the balance washer and in contact with the balance washer, wherein the first magnetic sensor and the second magnetic sensor are arranged to respectively correspond to the first magnet and the second magnet.

Other novel features of the disclosure will become more apparent from the following detailed description when taken in conjunction with the accompanying drawings.

DETAILED DESCRIPTION OF EMBODIMENT

Figure 1:
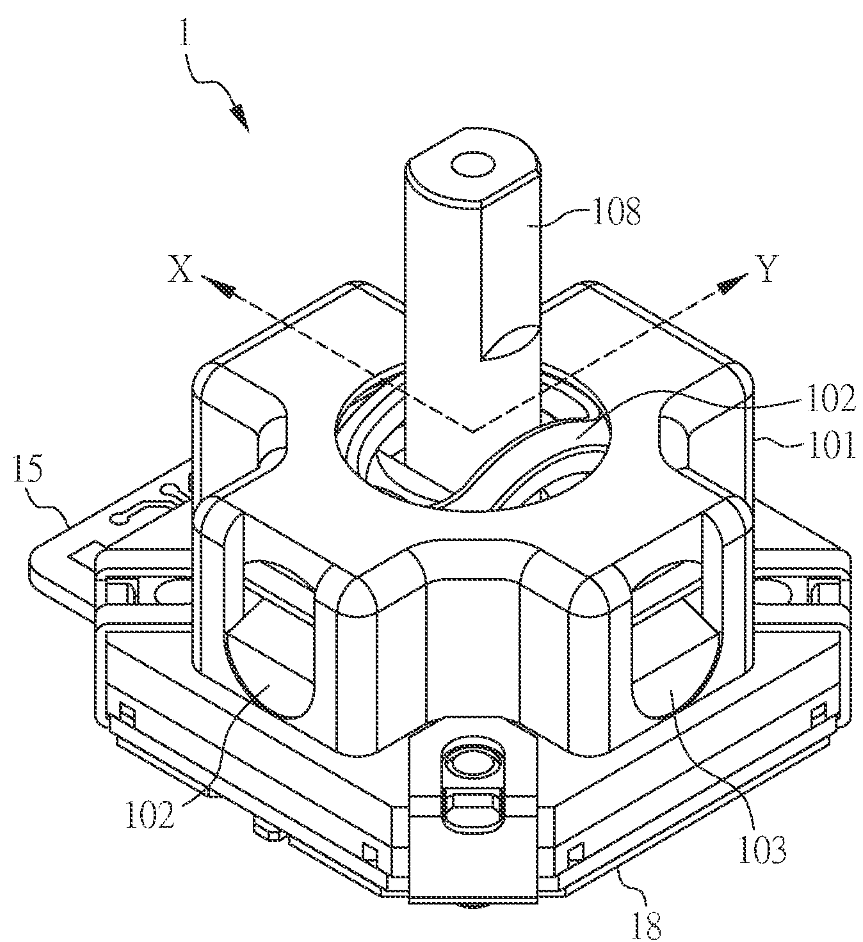
FIG. 1 is a perspective view of a multi-directional output device according to a preferred embodiment of the present invention.
Figure 2:
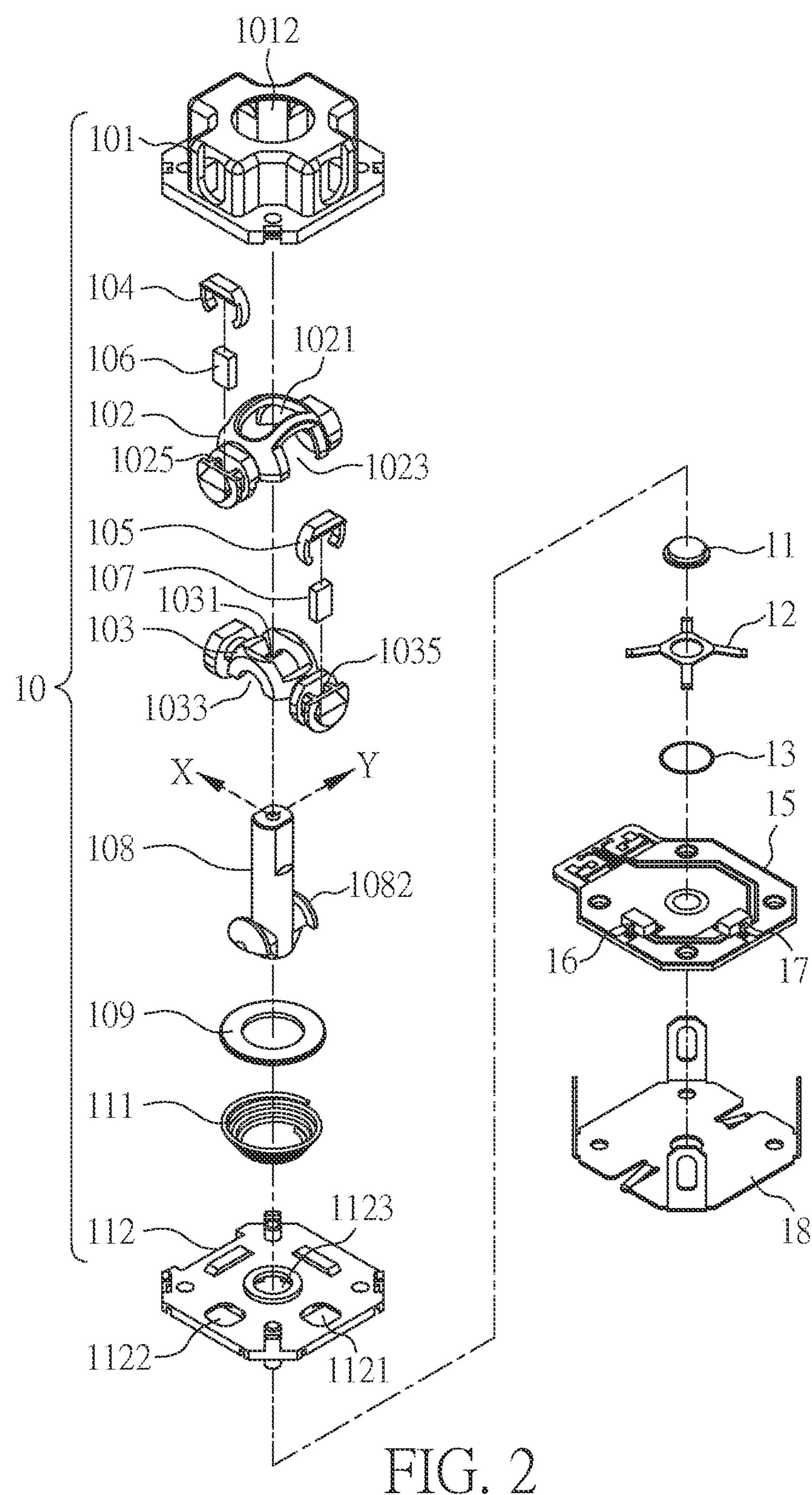
FIG. 2 is an exploded view of a multi-directional output device according to a preferred embodiment of the present invention.

Please refer to FIG. 1 and FIG. 2, which are respectively a perspective view and an exploded view of a multi-directional output device according to a preferred embodiment of the present invention. As shown, the multi-directional output device 1 of the present invention includes a direction control unit 10, a pressing driving body 11, a leaf spring 12, a switch spring piece 13, a printed circuit board 15, a first magnetic sensor 16, a second magnetic sensor 17 and a fixing plate 18. The direction control unit 10 is disposed on the printed circuit board 15, and includes an upper cover 101, a first rotation driving body 102, a second rotation driving body 103, a first fixing ring 104, and a second fixing ring 105, a first magnet 106, a second magnet 107, a shaft stick 108, a balance washer 109, an annular spring 111 and a lower cover 112.

In the aforementioned direction control unit 10, the upper cover 101 has an opening 1012 and the upper cover 101 is disposed on the lower cover 112, so that the upper cover 101 and the lower cover 112 are combined in a snapping or screwing manner, for example, in which an accommodation space is provided to accommodate the first rotary driving body 102, the second rotary driving body 103, the first fixing ring 104, the second fixing ring 105, the first magnet 106, the second magnet 107, the shaft stick 108, the balance washer 109, the annular spring 111, etc. The aforementioned fixing plate 18 is disposed under the direction control unit 10 and is combined with the direction control unit 10 from bottom to top, between which the pressing driving body 11, the leaf spring 12, the switch spring piece 13 and the printed circuit board 15 are accommodated.

The aforementioned first rotary driving body 102 and the second rotary driving body 103 are each a rotatable elongated arc-shaped structure, and each has an elongated center hole 1021, 1031 disposed in the center of the elongated arc-shaped structure, and two recessed portions 1023, 1033 respectively disposed on two sides of the elongated arc-shaped structure. After assembly, the long side of the elongated arc-shaped structure of the first rotary driving body 102 extends in the second direction (Y-axis direction), and the long side of the elongated arc-shaped structure of the rotary driving body 103 extends in the first direction (X-axis direction). The first rotary driving body 102 and the second rotary driving body 103 are arranged in such a manner the first rotary driving body 102 is disposed above the second rotary driving body 103 and the two are substantially crossed perpendicularly to each other so that the elongated center holes 1021 and 1031 of the two are crossed and aligned with each other. The second rotary driving body 103 is engaged into the recessed portion 1023 of the first rotary driving body 102. Furthermore, the first magnet 106 is fixed on one end of the first rotary driving body 102, and the second magnet 107 is fixed on one end of the second rotary driving body 103. Preferably, the first rotary driving body 102 has a first accommodation slot 1025 provided at one end to accommodate the first magnet 106 that is adhered to the first accommodation slot 1025 by glue or is restricted by the first fixing ring 104 clamped on the first accommodation slot 1025, so as to fix the first magnet 106 in the first accommodation slot 1025. Similarly, the second rotary driving body 103 has a second accommodation slot 1035 provided at one end to accommodate the second magnet 107 that is adhered to the second accommodation slot 1035 by glue or is restricted by the second fixing ring 105 clamped on the second accommodation slot 1035, so as to fix the second magnet 107 in the second accommodation slot 1035.

One end (upper end) of the aforementioned shaft stick 108 passes from the bottoms of the first rotary driving body 102 and the second rotary driving body 103 through the elongated center holes 1021, 1031 of the two and through the opening 1012 of the upper cover 101 for being manipulated by the user. The other end (lower end) of the shaft stick 108 has two sides each having a protruding portion 1082. After assembly, the protruding portion 1082 is combined with the recessed portion 1033 of the second rotary driving body 103 to prevent the shaft stick 108 from unexpected rotation. The aforementioned balance washer 109 is disposed under the shaft stick 108 and may contact the lower ends of the first rotary driving body 102 and the second rotary driving body 103. The aforementioned annular spring 111 is arranged on the lower cover 112 and is disposed under the balance washer 109 and in contact with the balance washer 109.

Figure 3:
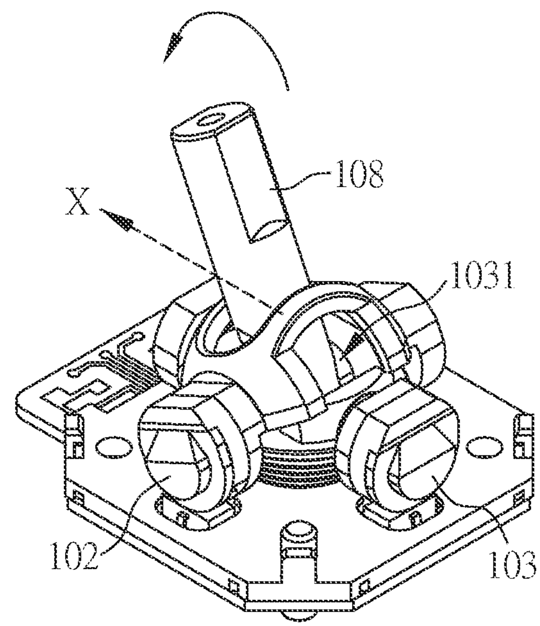
FIG. 3 is a schematic diagram of the multi-directional output device in which rocking of shaft stick in the first direction is performed according to a preferred embodiment of the present invention.
Figure 4:
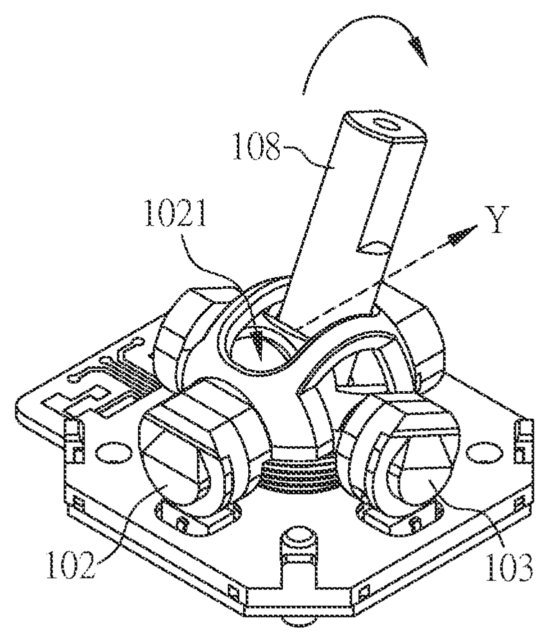
FIG. 4 is a schematic diagram of the multi-directional output device in which rocking of shaft stick in the second direction is performed according to a preferred embodiment of the present invention.

With the aforementioned direction control unit 10, the shaft stick 108 may be manipulated by the user to rock in the 360-degree direction of the plane formed by the first direction (X-axis direction) and the second direction (Y-axis direction), wherein the first direction and the second direction are substantially perpendicular to each other. When rocking the shaft stick 108 in the first direction, with reference to FIG. 3 as well, the shaft stick 108 drives the first rotary driving body 102 to rotate slightly in the counter-clockwise direction, and the shaft stick 108 is tangent to and moves in the elongated center hole 1031 of the second rotary driving body 103. When rocking the shaft stick 108 in the second direction, with reference to FIG. 4 as well, the shaft stick 108 drives the second rotary driving body 103 to rotate slightly in the clockwise direction, and the shaft stick 108 is tangent to and moves in the elongated center hole 1021 of the first rotary driving body 102. The above description takes the shaft stick 108 in the first direction and the second direction as an example to facilitate the explanation that the shaft stick 108 drives the first rotary driving body 102 and the second rotary driving body 103 to rotate. However, in the present invention, the shaft stick 108 may be rocked in any direction at the intersection point of the axis in the first direction and the axis in the second direction. For example, when rocking the shaft stick 108 in a direction that is not completely aligned with the first direction, in addition to driving of the rotary driving body 102, it will also drive the rotary driving body 103 in the second direction. Moreover, for example, when rocking the shaft stick 108 in a direction that is not completely aligned with the second direction, in addition to driving of the rotary driving body 103, it will also drive the rotary driving body 102 in the first direction. That is, when rocking the shaft stick 108 in the 360-degree direction of the plane formed by the first direction and the second direction, the shaft stick 108 may selectively drive the first rotary driving body 102 and the second rotary driving body 103 to rotate at the same time.

Furthermore, with the arrangement of the aforementioned annular spring 111 and the balance washer 109, a force for resetting the shaft stick 108 may be provided, so that the shaft stick 108 may return to its original state (vertical state) after rocking. The annular spring 111 disposed under the balance washer 109 pushes the balance washer 109 upward with its elastic force to further push the first rotary driving body 102 and the second rotary driving body 103, so that the balance washer 109 is coplanar with the contact surface at the lower ends of the first rotary driving body 102 and the second rotary driving body 103, thereby resetting the shaft stick 108 to a vertical state. Therefore, after the user rocks the shaft stick 108 from the vertical state toward the first direction or the second direction, the shaft stick 108 may automatically return to its original vertical state.

Figure 5:
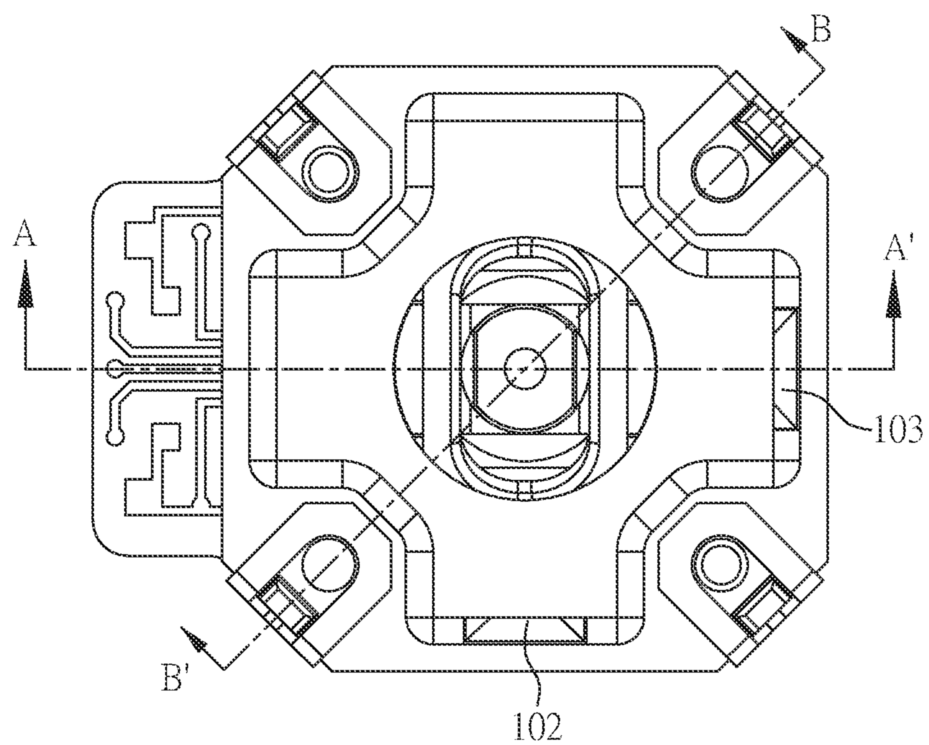
FIG. 5 shows a top view of the multi-directional output device according to a preferred embodiment of the present invention.
Figure 6:
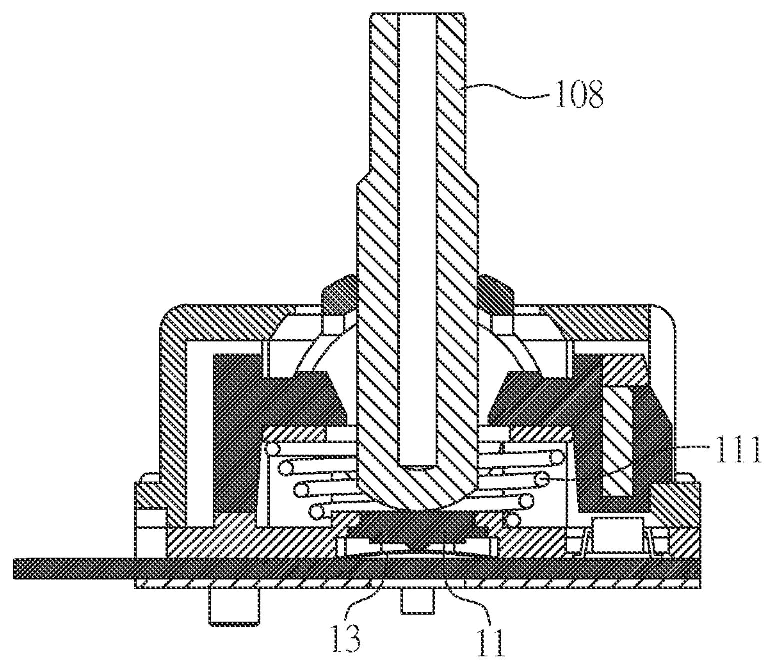
FIG. 6 is a schematic diagram of the multi-directional output device in which switch pressing is performed according to a preferred embodiment of the present invention.
Figure 7:
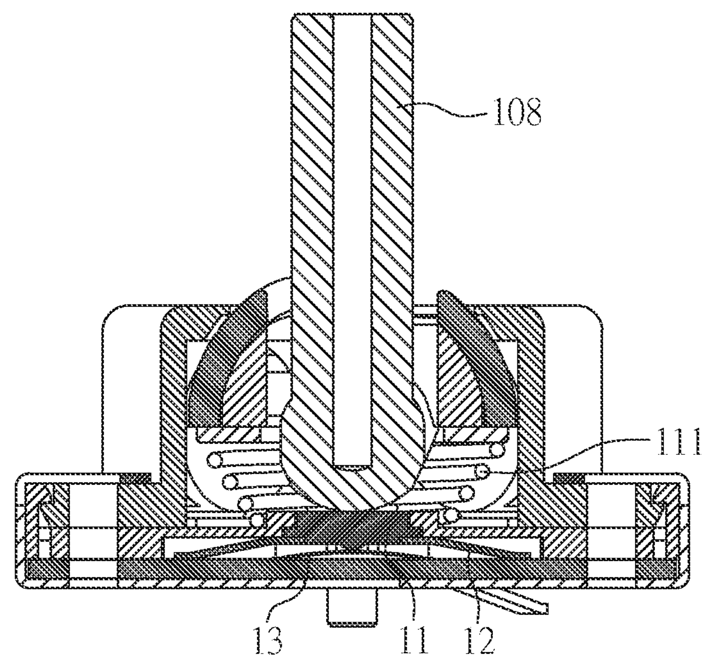
FIG. 7 is another schematic diagram of the multi-directional output device in which switch pressing is performed according to a preferred embodiment of the present invention.

Please refer to FIG. 2 again, the aforementioned lower cover 112 has a pressing hole 1123 disposed at the center of the lower cover 112 and corresponding to the lower end of the shaft stick 108, and two accommodating spaces 1121, 1122 respectively disposed on locations adjacent to two neighboring sides of the lower cover 112 and respectively corresponding to the first magnet 106 and the second magnet 107, wherein each accommodating space 1121, 1122 may be, for example, a hole, a recess or the like defined in the lower cover 112. The aforementioned switch spring piece 13 is provided on the printed circuit board 15, and the aforementioned pressing driving body 11 is provided on the switch spring piece 13 and corresponds to the lower end of the shaft stick 108 through the pressing hole 1123 of the lower cover 112. Accordingly, in order to show the operation of the multi-directional output device 1 being used as a pressing switch, FIG. 5 shows a top view of the multi-directional output device 1 according to a preferred embodiment of the present invention, and FIG. 6 is a cross-sectional view of the multi-directional output device taken along line A-A' in FIG. 5 (without leaf spring 12 installed), in which the user may press the shaft stick 108 and, with the elastic force of the annular spring 111, the lower end of the shaft stick 108 is made to push downwards against the pressing driving body 11 through the pressing hole 1123 of the lower cover 112, so that the pressing driving body 11 may press the switch spring piece 13 to perform the pressing switch operation on the circuit components of the printed circuit board 15. In addition, alternatively, FIG. 2 shows that a leaf spring 12 may be additionally provided between the switch spring piece 13 and the pressing driving body 11. The leaf spring 12 is a hollow circle and has four elastic legs extending outward, which may further adjust the elastic force provided by the switch spring piece. As a result, as shown in FIG. 7, which is a cross-sectional view of the multi-directional output device taken along line B-B' in FIG. 5 (with leaf spring 12 installed), in which the user may press the shaft stick 108 and, with the elastic force of the annular spring 111 and the leaf spring 12, the lower end of the shaft stick 108 is made to push downwards against the pressing driving body 11 through the pressing hole 1123 of the lower cover 112 to press the switch spring piece 13 so as to perform the pressing switch operation on the circuit components of the printed circuit board 15.

Figure 8:
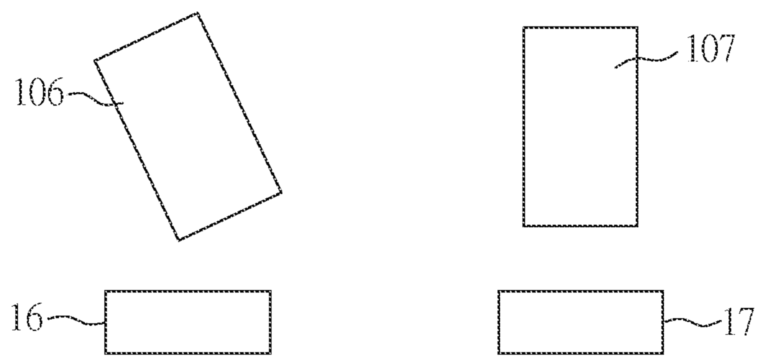
FIG. 8 is a schematic diagram illustrating the angle change of the first magnet when rocking the shaft stick of the multi-directional output device in the first direction according to a preferred embodiment of the present invention.
Figure 9:
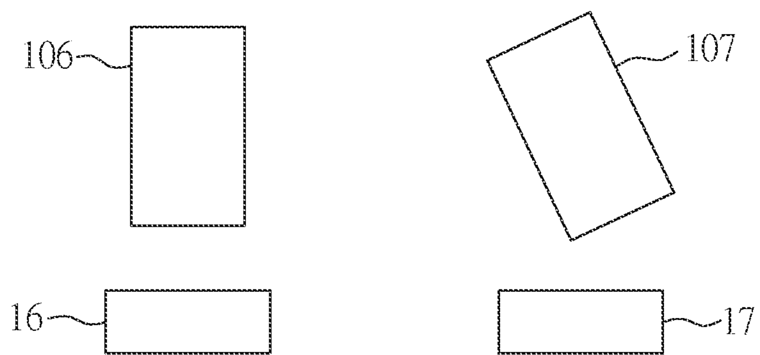
FIG. 9 is a schematic diagram illustrating the angle change of the first magnet when rocking the shaft stick of the multi-directional output device in the second direction according to a preferred embodiment of the present invention.

The aforementioned first magnetic sensor 16 and second magnetic sensor 17 are arranged on the printed circuit board 15, and are disposed adjacent to two neighboring sides of the printed circuit board 15 and respectively correspond to the first magnet 106 and the second magnet 107 through the two accommodating spaces 1121, 1122 of the lower cover 112. Therefore, when rocking the shaft stick 108 in the first direction, for example, as shown in FIG. 8, the first magnet 106 disposed on the first rotary driving body 102 is also rotated to generate the change in angle. The first magnetic sensor 16 may sense the change in the magnetic field of the first magnet 106 following the change in angle of the first magnet 106. Similarly, when rocking the shaft stick 108 in the second direction, for example, as shown in FIG. 9, the second magnet 107 disposed on the second rotary driving body 103 is also rotated to generate the change in angle. The second magnetic sensor 17 may sense the change in the magnetic field of the second magnet 107 following the change in angle of the second magnet 107. Accordingly, it can be seen that, when rocking the shaft stick 108 in any direction of the plane formed by the first direction and the second direction, the first magnetic sensor 16 and the second magnetic sensor 17 may respectively sense the changes in the magnetic field of the first magnet 106 and the second magnet 107 following the changes in angles, and the magnetic field and magnetic field change signals acquired by the first magnetic sensor 16 and the second magnetic sensor 17 are converted through the circuit on the printed circuit board 15 into corresponding electrical signals for output, with which the data related to speed, force, direction, distance, etc. applied by the user for rocking the shaft stick 108 can be calculated, thereby achieving non-contact control.

With the above design, the present invention makes use of two magnetic sensors to sense changes in the magnetic field of two magnets that may be rotated in response to the rocking of the shaft stick, so that it is possible to perform manipulation in a non-contact manner without the wearing problem caused by brush contact, thereby greatly increasing the service life and strengthening the reset accuracy in operating the shaft stick to improve the signal accuracy. Moreover, since the shaft stick may be used as a button, there is no need to install additional buttons, which may further reduce the size so as to design a small-scale control device.

The aforementioned specific embodiments should be construed as merely illustrative, and not limiting the rest of the present disclosure in any way.

The invention claimed is:

1. A multi-directional output device, comprising:

a printed circuit board disposed thereon a first magnetic sensor and a second magnetic sensor; and a direction control unit provided on the printed circuit board, and including:

a first rotary driving body and a second rotary driving body, each being a rotatable elongated arc-shaped structure and each having an elongated center hole disposed in a center of the corresponding elongated arc-shaped structure, wherein the first rotary driving body is disposed above and crossed perpendicularly with the second rotary driving body so that the elongated center holes are crossed and aligned with each other;

a first magnet and a second magnet respectively fixed on one end of the first rotary driving body and one end of the second rotary driving body;

a shaft stick having an upper end and a lower end, wherein the upper end passes through the elongated center holes from bottoms of the first rotary driving body and the second rotary driving body;

a balance washer disposed under the shaft stick and in contact with the first rotary driving body and the second rotary driving body; and an annular spring disposed under the balance washer and in contact with the balance washer, wherein the first magnetic sensor and the second magnetic sensor are arranged to respectively correspond to the first magnet and the second magnet.

2. The multi-directional output device as claimed in claim 1, wherein, when rocking the shaft stick in a first direction, the shaft stick drives the first rotary driving body to rotate, and the shaft stick is tangent to and moves in the elongated center hole of the second rotary driving body; when rocking the shaft stick in a second direction, the shaft stick drives the second rotary driving body to rotate, and the shaft stick is tangent to and moves in the elongated center hole of the first rotary driving body, where the first direction is perpendicular to the second direction.

3. The multi-directional output device as claimed in claim 2, wherein, when rocking the shaft stick in any direction on a plane formed by the first direction and the second direction, the shaft stick selectively drives the first rotary driving body and the second rotary driving body simultaneously to rotate.

4. The multi-directional output device as claimed in claim 1, further comprising: a switch spring piece disposed on the printed circuit board; and a pressing driving body disposed on the switch spring piece and corresponding to the lower end of the shaft stick.

5. The multi-directional output device as claimed in claim 4, further comprising a leaf spring disposed between the switch spring piece and the pressing driving body.

6. The multi-directional output device as claimed in claim 2, wherein the first rotary driving body and the second rotary driving body each have two recessed portions respectively disposed on two sides of the corresponding elongated arc-shaped structure, and the second rotary driving body is engaged into the two recessed portions of the first rotary driving body.

7. The multi-directional output device as claimed in claim 6, wherein the lower end of the shaft stick has two sides, each having a protruding portion, and the two protruding portions are combined with the two recessed portions of the second rotary driving body.

8. The multi-directional output device as claimed in claim 1, wherein a first accommodation slot is provided at one end of the first rotating drive body to accommodate the first magnet, and a second accommodation slot is provided at one end of the second rotary driving body to accommodate the second magnet.

9. The multi-directional output device as claimed in claim 8, wherein the first magnet and the second magnet are respectively adhered to the first accommodation slot and the second accommodation slot by glue.

10. The multi-directional output device as claimed in claim 8, wherein the direction control unit further includes: a first fixing ring clamped on the first accommodation slot to fix the first magnet; and a second fixing ring clamped on the second accommodation slot to fix the second magnet.

11. The multi-directional output device as claimed in claim 1, wherein the direction control unit further includes:

a lower cover having a pressing hole disposed at a center of the lower cover and corresponding to the lower end of the shaft stick; and an upper cover disposed above the lower cover and provided with an opening, wherein the upper cover is combined with the lower cover to provide an accommodation space to accommodate the first rotary driving body, the second rotary driving body, the first magnet, the second magnet, the shaft stick, the balance washer and the annular spring, and the upper end of the shaft stick passes through the opening of the upper cover.

12. The multi-directional output device as claimed in claim 11, wherein the lower cover further has two accommodating spaces respectively corresponding to the first magnet and the second magnet, and the first magnetic sensor and the second magnetic sensor respectively correspond to the first magnet and the second magnet through the two accommodating space.

13. The multi-directional output device as claimed in claim 5, further comprising a fixing plate disposed under the direction control unit and combined with the direction control unit to accommodate the pressing driving body, the leaf spring, the switch spring piece and the printed circuit board.

* * * * *